(12) United States Patent
Marks et al.

(10) Patent No.: US 6,399,221 B1
(45) Date of Patent: Jun. 4, 2002

(54) ORGANIC LIGHT-EMITTING DIODES AND METHODS FOR ASSEMBLY AND EMISSION CONTROL

(75) Inventors: Tobin J. Marks; Joshua E. Malinsky, both of Evanston, IL (US); Bernard Kippelen, Tucson, AZ (US); Nasser Peyghambarian, Tucson, AZ (US); Ghassan E. Jabbour, Tucson, AZ (US)

(73) Assignee: Northwestern University, Evanston, IL (US)

(*) Notice: Subject to any disclaimer, the term of this patent is extended or adjusted under 35 U.S.C. 154(b) by 0 days.

(21) Appl. No.: 09/187,891

(22) Filed: Nov. 6, 1998

Related U.S. Application Data

(63) Continuation-in-part of application No. 08/673,600, filed on Jun. 25, 1996, now Pat. No. 5,834,100.

(51) Int. Cl.$^7$ ................................................. H05B 33/12
(52) U.S. Cl. ..................... 428/690; 428/917; 428/447; 428/448; 428/450; 313/504; 313/506; 427/66
(58) Field of Search ................................. 428/690, 917, 428/446, 447, 448, 450; 313/504, 506; 427/66

(56) References Cited

U.S. PATENT DOCUMENTS

| | | |
|---|---|---|
| 3,172,862 A | 3/1965 | Gurnee et al. |
| 3,173,050 A | 3/1965 | Gurnee |
| 3,567,450 A | 3/1971 | Brantly et al. |
| 3,658,520 A | 4/1972 | Brantly et al. |
| 3,710,167 A | 1/1973 | Dresner et al. |
| 4,539,507 A | 9/1985 | Van Slyke et al. ........... 313/504 |
| 4,769,292 A | 9/1988 | Tang et al. .................... 428/69 |
| 5,130,603 A | 7/1992 | Tokailin et al. ............. 313/504 |
| 5,151,629 A | 9/1992 | Van Slyke .................. 313/504 |
| 5,156,918 A | 10/1992 | Marks et al. ............... 428/447 |
| 5,276,381 A | 1/1994 | Wakimoto et al. ......... 313/504 |
| 5,336,546 A | 8/1994 | Hironaka et al. ........... 428/209 |
| 5,409,703 A | 4/1995 | McAnalley et al. ........ 424/435 |
| 5,409,783 A | 4/1995 | Tang et al. .................. 428/690 |
| 5,414,069 A | 5/1995 | Cumming et al. .......... 528/310 |
| 5,457,357 A | 10/1995 | Fujii et al. .................... 313/506 |
| 5,834,100 A | * 11/1998 | Marks et al. ............... 428/209 |
| 6,165,383 A | * 12/2000 | Chou ..................... 252/301.16 |

OTHER PUBLICATIONS

Advanced Materials, 1997, 9, No. 3, pp. 222–225, by Frank Niesch et al., "Derivatized Electrodes in the Construction of Organic Light Emitting Diodes". (No month).

Advanced Materials, 1999, 11, No. 2, pp. 107–112, by Morais et al., "Hybrid Organic–Inorganic Light–Emmitting Diodes". (No month).

Appl. Phys. Lett. vol. 74, No. 15, Apr. 12, 1999, by Deng et al., "Enhanced Brightness and Efficiency in Organic Electrouminescent Devices using $SiO_2$ Buffer layers".

\* cited by examiner

*Primary Examiner*—Marie Yamnitzky
(74) *Attorney, Agent, or Firm*—Reinhart Boerner Van Deuren, S.C.

(57) ABSTRACT

New organic light-emitting diodes and related electroluminescent devices and methods for fabrication, using siloxane self-assembly techniques.

25 Claims, 9 Drawing Sheets

(1) ITO

+

(2) ITO + HTL (3) ITO + HTL + ETL

Block Representation

Molecular Representation

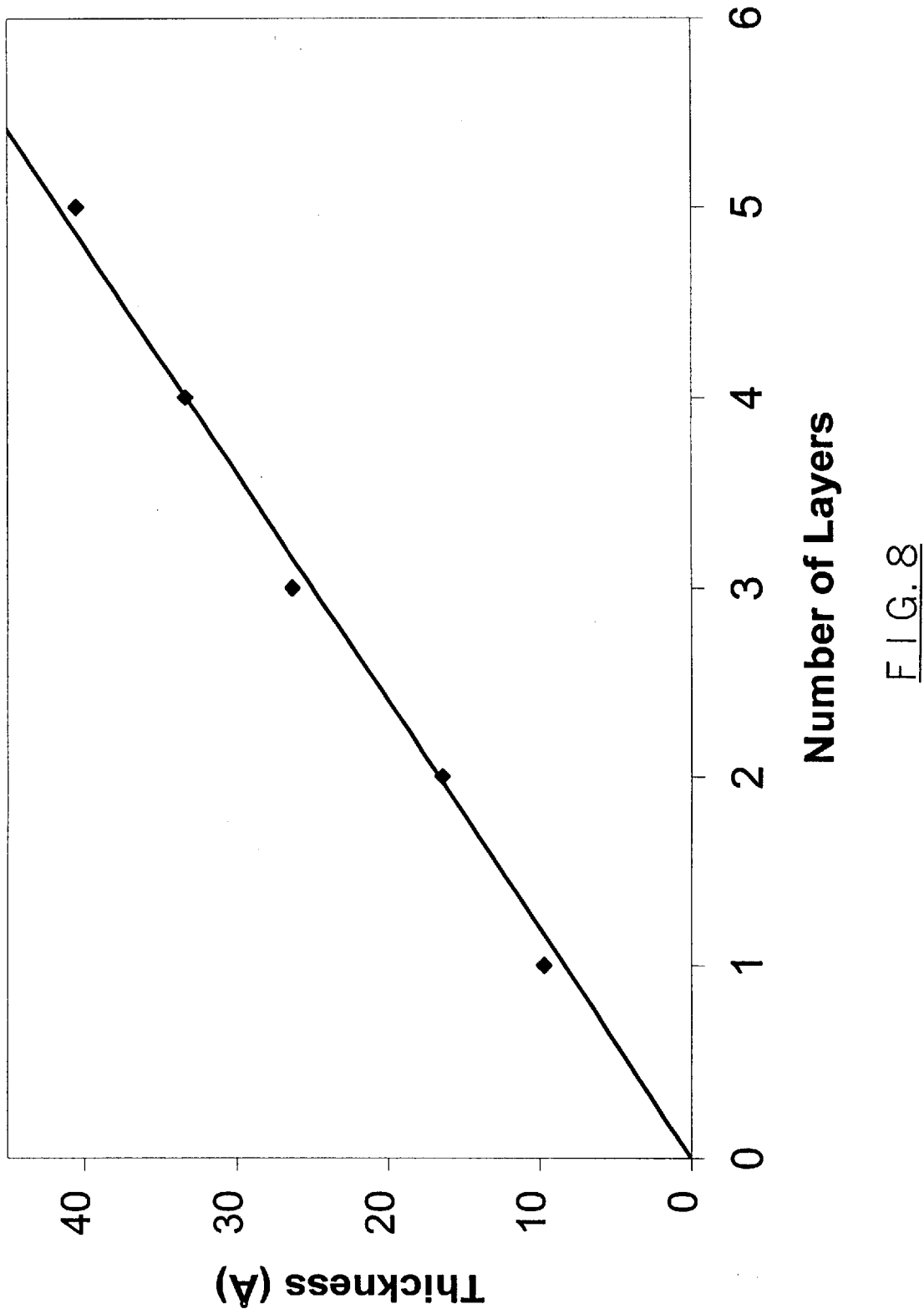
F I G. 8

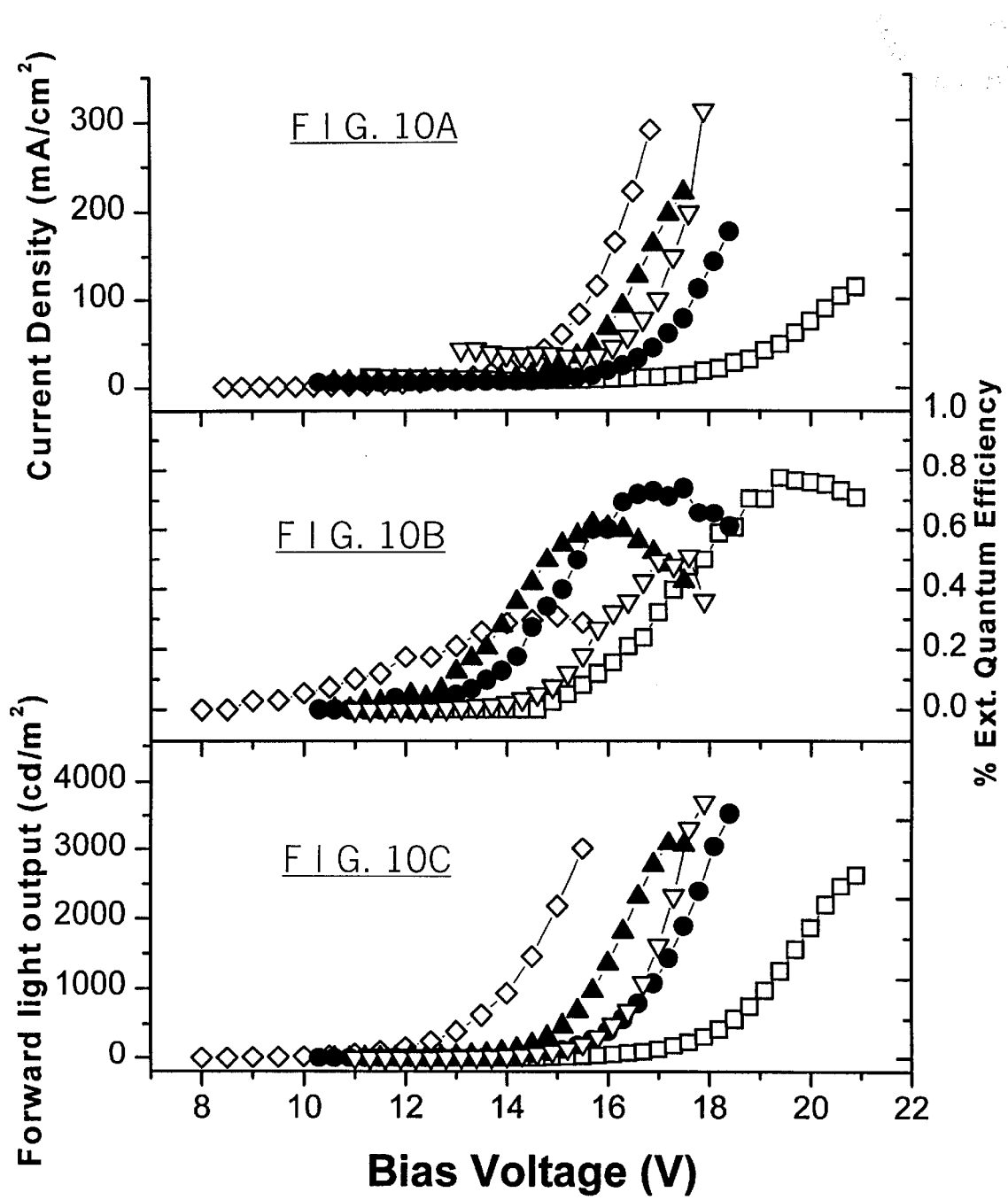

ORGANIC LIGHT-EMITTING DIODES AND METHODS FOR ASSEMBLY AND EMISSION CONTROL

This is a continuation-in-part of application(s) Ser. No. 08/673,600 filed on Jun. 25, 1996, now U.S. Pat. No. 5,834,100.

CONTRACTUAL ORIGIN OF INVENTION

The United States Government has rights to this invention pursuant to Grant No. N000149511319 from the Office of Naval Research and Grant No. DMR912000 from the National Science Foundation, both to Northwestern University.

BACKGROUND OF THE INVENTION

This invention relates generally to organic electroluminescent devices with organic films between anodic and cathodic electrodes, and more particularly to such devices and methods for their assembly using the condensation of various silicon moieties.

Organic electroluminescent devices have been known in various degrees of sophistication, since the early 1970's. Throughout their development and consistent with their function and mode of operation, they can be described generally by way of their physical construction. Such devices are characterized generally by two electrodes which are separated by a series of layered organic films that emit light when an electric potential is applied across the two electrodes. A typical device can consist, in sequence, of an anode, an organic hole injection layer, an organic hole transport layer, an organic electron transport layer, and a cathode. Holes are generated at a transparent electrode, such as one constructed of indium-tin-oxide, and transported through a hole-injecting or hole-transporting layer to an interface with an electron-transporting or electron-injecting layer which transports electrons from a metal electrode. An emissive layer can also be incorporated at the interface between the hole-transporting layer and the electron-transporting layer to improve emission efficiency and to modify the color of the emitted light.

Significant progress has been made in the design and construction of polymer- and molecule-based electroluminescent devices, for light-emitting diodes, displays and the like. Other structures have been explored and include the designated "DH" structure which does not include the hole injection layer, the "SH-A" structure which does not include the hole injection layer or the electron transport layer, and the "SH-B" structure which does not include the hole injection layer or the hole transport layer. See, U.S. Pat. No. 5,457,357 and in particular col. 1 thereof, which is incorporated herein by reference in its entirety.

The search for an efficient, effective electroluminescent device and/or method for its production has been an ongoing concern. Several approaches have been used with certain success. However, the prior art has associated with it a number of significant problems and deficiencies. Most are related to the devices and the methods by which they are constructed, and result from the polymeric and/or molecular components and assembly techniques used therewith.

The fabrication of polymer-based electroluminescent devices employs spin coating techniques to apply the layers used for the device. This approach is limited by the inherently poor control of the layer thickness in polymer spin coating, diffusion between the layers, pinholes in the layers, and inability to produce thin layers which leads to poor light collection efficiency and the necessity of high D.C. driving voltages. The types of usefull polymers, typically poly(phenylenevinylenes), are greatly limited and most are environmentally unstable over prolonged use periods.

The molecule-based approach uses vapor deposition techniques to put down thin films of volatile molecules. It offers the potential of a wide choice of possible building blocks, for tailoring emissive and other characteristics, and reasonably precise layer thickness control. Impressive advances have recently been achieved in molecular building blocks—especially in electron transporters and emitters, layer structure design (three versus two layers), and light collection/transmission structures (microcavities).

Nevertheless, filter advances must be made before these devices are optimum. Component layers which are thinner than achievable by organic vapor deposition techniques would allow lower DC driving voltages and better light transmission collection characteristics. Many of the desirable component molecules are nonvolatile or poorly volatile, with the latter requiring expensive, high vacuum or MBE growth equipment. Such line-of-site growth techniques also have limitation in terms of conformal coverage. Furthermore, many of the desirable molecular components do not form smooth, pinhole-free, transparent films under these conditions nor do they form epitaxial/quasiepitaxial multilayers having abrupt interfaces. Finally, the mechanical stability of molecule-based films can be problematic, especially for large-area applications or on flexible backings.

BRIEF DESCRIPTION OF THE DRAWINGS

In FIG. 1, M is Cu, Zn, $SiCl_2$, or 2H; Q is N or C(X), where X is a substituted or unsubstituted alkyl or aryl group; and R is H, trichlorosilyl, trialkoxysilyl, or a moiety having 1 to 6 carbon atoms which can include trichlorosilyl or trialkoxysilyl groups, substituted on the $C_1$–$C_4$, $C_8$–$C_{11}$, $C_{15}$–$C_{18}$ and/or $C_{22}$–$C_{25}$ positions. In FIG. B, M is Cu. Zn, $SiCl_2$, or 2H; Q is N or C(X), where X is a substituted or unsubstituted alkyl or aryl group; and $T_1/T_2$ is H, trichlorosilyl, trialkoxysilyl, or a moiety having 1 to 6 carbon atoms which can include trichlorosilyl or trialkoxysilyl groups.

In FIG. 2A, $R_2$, $R_3$ and/or $R_4$ can be H, trihalosilyl, trialkoxysilyl, dihalosilyl, dialkoxysilyl, or a moiety having 1 to 6 carbon atoms which can include dialkyldichlorosilyl, dialkyldialkoxysilyl, trichlorosilyl or trialkoxysilyl groups substituted anywhere on the aryl positions. In FIG. 2B, $Q_1$ and $Q_2$ can be substituted or unsubstituted tertiary aryl amines, such as those described with FIG. 2A; and G is a linking group to include but not limited to an alkyl, aryl, cylcohexyl or heteroatom group. In FIG. 2C, Ar is an arylene group; n is the number of arylene groups from 1–4; and $R_5$, $R_6$, $R_7$, and/or $R_8$ can be H, trihalosilyl, trialkoxysilyl, dihalosilyl, dialkoxysilyl or a moiety having 1 to 6 carbon atoms which can include dialkyldichlorosilyl, dialkyldialkoxysilyl, trichlorosilyl or trialkoxysilyl groups substituted anywhere on the aryl positions.

In FIG. 3A, $R_9$ and $R_{10}$ can be H, trihalosilyl, trialkoxysilyl, dihalosilyl, dialkoxysilyl, or a moiety having 1 to 6 carbon atoms which can include dialkyldichlorosilyl, dialkyldialkoxysilyl, trichlorosilyl or trialkoxysilyl groups substituted anywhere on the aryl positions. In FIG. 3B, M is Al or Ga; and $R_{11}$–$R_{14}$ can be H, trihalosilyl, trialkoxysilyl, dihalosilyl, dialkoxysilyl, or a moiety having 1 to 6 carbon atoms which can include dialkyldichlorosilyl, dialkyldialkoxysilyl, trichlorosilyl or trialkoxysilyl groups substituted anywhere on the aryl positions. In FIG. 3C, Ar is arylene; and $R_{15}$–$R_{18}$ can be H, trihalosilyl, trialkoxysilyl, dihalosilyl, dialkoxysilyl, or a moiety having 1 to 6 carbon atoms which can include dialkyldichlorosilyl, dialkyldialkoxysilyl, trichlorosilyl or trialkoxysilyl groups substituted anywhere on the aryl positions.

In FIGS. 4A–4C, X is O or S; and $R_{19}$–$R_{24}$ can be aryl groups substituted with the following substituents anywhere on the aryl ring: trihalosilyl, trialkoxysilyl, dihalosilyl, dialkoxysilyl, or a moiety having 1 to 6 carbon atoms which can contain dialkyldichlorosilyl, dialkyldialkoxysilyl, trichlorosilyl or trialkoxysilyl groups.

FIG. 5A illustrates the hydrolysis of an assembled silicon/silane component/agent to provide an Si—OH functionality reactive toward a silicon/silane moiety of another component, agent or conductive layer. The block and molecular representations of FIG. 5B illustrate a completed assembly.

FIG. 8 graphically correlates x-ray reflectivity measurements of film thickness with the number of capping layers applied to a substrate. As calculated from the slope of the line (y=8.3184x), each layer is about 7.84 Å in dimensional thickness.

FIGS. 10A–C graphically illustrate various utilities and/or performance characteristics (current density, quantum efficiency and forward light output, respectively, versus voltage) achievable through use of the present invention, as a function of the number of capping layers on an electrode surface: 0 layers, bare ITO (◇) 1 layer, 8 Å (□), 2 layers, 17 Å (●), 3 layers, 25 Å (▼) and 4 layers, 33 Å (▽). Reference is made to example 10.

SUMMARY OF THE INVENTION

Figure 1A:
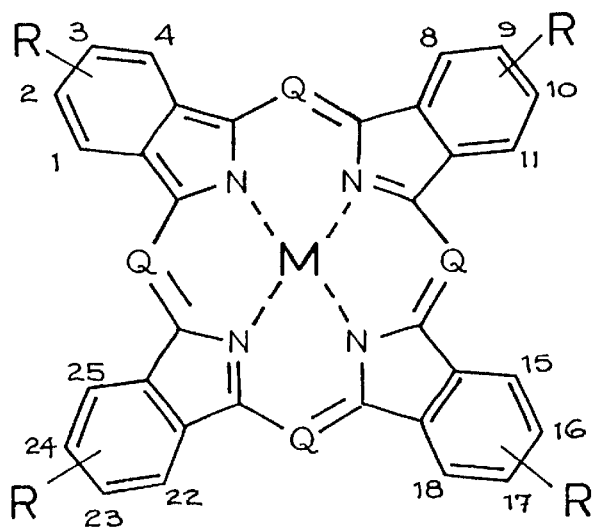
FIGS. 1A and 1B show structural formulae for porphyrinic compounds which are illustrative examples of compounds of the type which can be used as hole injection components/agents in the preparation of the molecular conductive or hole injection layers and electroluminescent media of this invention.

In light of the foregoing, it is an object of the present invention to provide electroluminescent articles and/or devices and method(s) for their production and/or assembly, thereby overcoming various deficiencies and shortcomings of the prior art, including those outlined above. It will be understood by those skilled in the art that one or more aspects of this invention can meet certain objectives, while one or more other aspects can meet certain other objectives. Each objective may not apply equally, in all its respects, to every aspect of this invention. As such, the following objects can be viewed the alternative with respect to any one aspect of this invention.

It is an object of the present invention to provide control over the thickness dimension of a luminescent medium and/or the conductive layers of such a medium, to control the wavelength of light emitted from any electroluminescent device and enhance the efficiency of such emission.

It can be another object of the present invention to provide molecular components for the construction and/or modification of an electroluminescent medium and/or the conductive layers thereof, which will allow lower driving and/or tun-on voltages than are available through use of conventional materials.

It can also be an object of the present invention to provide component molecules which can be used effectively in liquid media without resort to high vacuum or MBE growth equipment.

It can also be an object of the present invention to provide conformal conductive layers and the molecular components thereof which allows for the smooth, uniform deposition on an electrode, substrate surface and/or previously-deposited layers.

It can also be an object of this invention to provide an electroluminescent medium having a hybrid structure and where one or more of the layers is applied by a spin-coat or vapor deposition technique to one or more self-assembled conductive layers.

Other objects, features and advantages of the present invention will be apparent from this summary of the invention and its descriptions of various preferred embodiments, and will be readily apparent to those skilled in the art having knowledge of various electroluminescent devices and assembly/production techniques. Such objects, features, benefits and advantages will be apparent from the above as taken into conjunction with the accompanying examples, data, figures and all reasonable inferences to be drawn therefrom, alone or with consideration of the references incorporated herein.

This invention describes, in part a new route to the fabrication of light-emitting organic multilayer heterojunction devices, usefull for both large and small, multicolored display applications. As described more fully below, electron and hole transporting layers, as well as the emissive layer, as well as any other additional layers, are applied, developed and/or modified by molecular self-assembly techniques. As such, the invention can provide precise control over the thickness of a luminescent medium or the conductive layers which make up such a medium, as well as provide maximum light generation efficiency. Use of the present invention provides strong covalent bonds between the constituent molecular components, such that the mechanical, thermal, chemical and/or photochemical stability of such media and/or conductive layers, as can be used with an electroluminescent device, are enhanced. The use of such components also promotes conformal surface coverage to prevent cracks and pinhole deformities.

More specifically, the siloxane self-assembly techniques described herein allow for the construction of molecule-based electroluminescent media and devices. As described more fully below, various molecular components can be utilized to control the thickness dimension of the luminescent media and/or conductive layers. Nanometer dimensions can be obtained, with self-sealing, conformal coverage. The resulting covalent, hydrophobic siloxane network imparts considerable mechanical strength, as well as enhancing the resistance of such media and/or devices to dielectric breakdown, moisture intrusion, and other degradative processes.

In part, the present invention is an electroluminescent article or device which includes (1) an anode, (2) a plurality of molecular conductive layers where one of the layers is coupled to the anode with silicon-oxygen bonds and each of the layers is coupled one to another with silicon-oxygen bonds, and (3) a cathode in the electrical contact with the conductive layers. More generally and within the scope of this invention, an anode is separated from a cathode by an organic luminescent medium. The anode and the cathode are connected to an external power source by conductors. The power source can be a continuous direct, alternating or an intermittent current voltage source. A convenient conventional power source, including any desired switching circuitry, which is capable of positively biasing the anode with respect to the cathode, can be employed. Either the anode or cathode can be at ground potential.

Figure 1B:
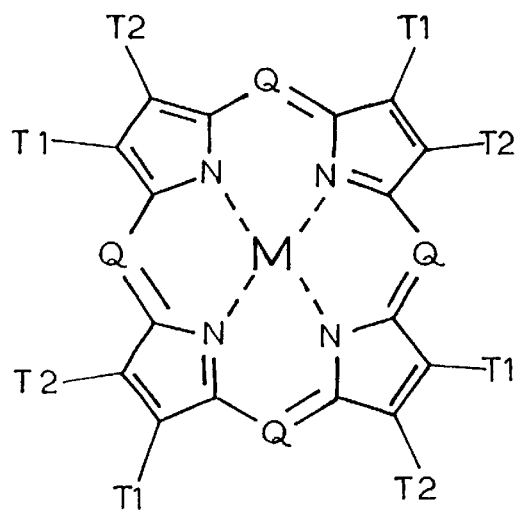

The conductive layers can include but are limited to a hole transport layer, a hole injection layer, an electron transport layer and an emissive layer. Under forward biasing conditions, the anode is at a higher potential than the cathode, and the anode injects holes (positive charge carriers) into the conductive layers and/or luminescent medium while the cathode injects electrons therein. The portion of the layers/medium adjacent to the anode forms a hole injecting and/or transporting zone while the portion of the layers/medium adjacent to the cathode forms an electron injecting and/or transporting zone. The injected holes and electrons each migrate toward the oppositely charged electrode, resulting in hole-electron interaction within the organic luminescent medium of conductive layers. A migrating electron drops from its conduction potential to a valence band in filling a hole to release energy as light. In such a manner, the organic luminescent layers/medium between the electrodes performs as a luminescent zone receiving mobile charge carriers from each electrode. Depending upon the construction of the article/device, the released light can be emitted from the luminescent conductive layers/medium through one or more of edges separating the electrodes, through the anode, through the cathode, or through any combination thereof. See, U.S. Pat. No. 5,409,783 and, in particular cols. 4–6 and FIG. 1 thereof, which is incorporated herein by reference in its entirety. As would be understood by those skilled in the art, reverse biasing of the electrodes will reverse the direction of mobile charge migration, interrupt charge injection, and terminate light emission. Consistent with the prior art, the present invention contemplates a forward biasing DC power source and reliance on external current interruption or modulation to regulate light emission.

As demonstrated and explained below, it is possible to maintain a current density compatible with efficient light emission while employing a relatively low voltage across the electrodes by limiting the total thickness of the organic luminescent medium to nanometer dimensions. At the molecular dimensions possible through use of this invention, an applied voltage of less than about 10 volts is sufficient for efficient light emission. As discussed more thoroughly herein, the thickness of the organic luminescent conductive layers/medium can be designed to control and/or determine the wavelength of emitted light, as well as reduce the applied voltage and/or increase in the field potential.

Given the nanometer dimensions of the organic luminescent layers/medium, light is usually emitted through one of the two electrodes. The electrode can be formed as a translucent or transparent coating, either on the organic layer/medium or on a separate translucent or transparent support. The layer/medium thickness is constructed to balance light transmission (or extinction) and electrical conductance (or resistance). Other considerations relating to the design, construction and/or structure of such articles or devices are as provided in the above referenced U.S. Pat. No. 5,409,783, such considerations as would be modified in accordance with the molecular conductive layers and assembly methods of the present invention.

In preferred embodiments, the conductive layers have molecular components, and each molecular component has at least two silicon moieties. In highly preferred embodiments, each silicon moiety is a halogenated or alkoxylated silane and silicon-oxygen bonds are obtainable from the condensation of the silane moieties with hydroxy functionalities. In preferred embodiments, the present invention employs an anode with a substrate having a hydroxylated surface portion. The surface portion is transparent to near-IR and visible wavelengths of light. In such highly preferred embodiments the hydroxylated surface portions include $SiO_2$, $In_2 \cdot xSnO_2$, Ge and Si, among other such materials.

In conjunction with anodes and the hydroxylated surface portions thereof, the conductive layers include molecular components, and each molecular component has at least two silicon moieties. As discussed above, in such embodiments, each silicon moiety is a halogenated or alkoxylated silane, and silicon-oxygen bonds are obtainable from the condensation of the silane moieties with hydroxy functionalities which can be on a surface portion of an anode. Consistent with such preferred embodiments, a cathode is in electrical contact with the conductive layers. In highly preferred embodiments, the cathode is vapor deposited on the conductive layers, and constructed of a material including Al, Mg, Ag, Au, In, Ca and alloys thereof.

In part, the present invention is a method of producing a light-emitting diode having enhanced stability and light generation efficiency. The method includes (1) providing an anode with a hydroxylated surface; (2) coupling the surface to a hole transport layer having a plurality of molecular components, with each component having at least two silicon moieties reactive with the surface, with coupling of one of the silicon moieties to form silicon-oxygen bonds between the surface and the hole transport layer; (3) coupling the hole transport layer to an electron transport layer, the electron transport layer having a plurality of molecular components with each of the components having at least two silicon moieties reactive with the hole transport layer, with the coupling of one of the silicon moieties to form silicon-oxygen bonds between the hole and electron transport layers; and (4) contacting the electron transport layer with a cathode material.

In preferred embodiments of this method, the hole transport layer includes a hole injecting zone of molecular components and a hole transporting zone of molecular components. Likewise, in preferred embodiments, each silicon moiety is a halogenated or alkoxylated silane such that, with respect to this embodiment, coupling the hole transport layer to the electron transport layer further includes hydrolyzing the halogenated or alkoxylated silane. Likewise, with respect to a halogenated or alkoxylated silane embodiment, contacting the electron transport layer with the cathode further includes hydrolyzing the silane.

In part, the present invention is a method of controlling the wavelength of light emitted from an electroluminescent device. The inventive method includes (1) providing in sequence a hole transport layer, an emissive layer and an electron transport layer to form a medium of organic luminescent layers; and (2) modifying the thickness dimension of at least one of the layers, each of the layers including molecular components corresponding to the layer and having at least two silicon moieties reactive to a hydroxy functionality and the layers coupled one to another by Si-O bonds, the modification by reaction of the corresponding molecular components one to another to form Si-O bonds between the molecular components, and the modification in sequence of the provision of the layers.

In preferred embodiments of this inventive method, at least one silicon moiety is unreacted after reaction with a hydroxy functionality. In highly preferred embodiments, modification then includes hydrolyzing the unreacted silicon moiety of one of the molecular components to form a hydroxysilyl functionality and condensing the hydroxysilyl functionality with a silicon moiety of another molecular component to form a siloxane bond sequence between the molecular components.

In highly preferred embodiments, the silicon moieties are halogenated or alkoxylated silane moieties. Such embodiments include modifying the thickness dimension by hydrolyzing the unreacted silane moiety of one of the molecular components to form a hydroxysilyl functionality and condensing the hydroxysilyl functionality with a silane moiety of another molecular component to form a siloxane bond sequence between the molecular components.

While the organic luminescent conductive layers/medium of this invention can be described as having a single organic hole injecting or transporting layer and a single electron injecting or transporting layer, modification of each of these layers with respect to dimensional thickness or into multiple layers, as more specifically described below, can result in further refinement or enhancement of device performance by way of the light emitted therefrom. When multiple electron injecting and transporting layers are present, the layer receiving holes is the layer in which hole-electron interaction occurs, thereby forming the luminescent or emissive layer of the device.

The articles/devices of this invention can emit light through either the cathode or the anode. Where emission is through the cathode, the anode need not be light transmissive. Transparent anodes can be formed of selected metal oxides or a combination of metal oxides having a suitably high work function. Preferred metal oxides have a work function of greater than 4 electron volts (eV). Suitable anode metal oxides can be chosen from among the high (>4 eV) work function materials. A transparent anode can also be formed of a transparent metal oxide layer on a support or as a separate foil or sheet.

The devices/articles of this invention can employ a cathode constructed of any metal, including any high or low work function metal, heretofore taught to be useful for this purpose and as further elaborated in that portion of the incorporated patent referenced in the preceding paragraph. As mentioned therein, fabrication, performance, and stability advantages can be realized by forming the cathode of a combination of a low work function (<4 eV) metal and at least one other metal. Available low work function metal choices for the cathode are listed in cols. 19–20 of the aforementioned incorporated patent, by periods of the Periodic Table of Elements and categorized into 0.5 eV work function groups. All work functions provided therein are from Sze, *Physics of semiconductor Devices*, Wiley, N.Y., 1969, p.366.

A second metal can be included in the cathode to increase storage and operational stability. The second metal can be chosen from among any metal other than an alkali metal. The second metal can itself be a low work function metal and thus be chosen from the above-referenced list and having a work function of less than 4 eV. To the extent that the second metal exhibits a low work function it can, of course, supplement the first metal in facilitating electron injection.

Alternatively, the second metal can be chosen from any of the various metals having a work function greater than 4 eV. These metals include elements resistant to oxidation and, therefore, those more commonly fabricated as metallic elements. To the extent the second metal remains invariant in the article or device, it can contribute to the stability. Available higher work function (4 eV or greater) metal choices for the cathode are listed in lines 50–69 of col. 20 and lines 1–15 of col. 21 of the aforementioned incorporated patent, by periods of the Periodic Table of Elements and categorized into 0.5 eV work function groups.

As described more fully in U.S. Pat. No. 5,156,918 which is incorporated herein by reference in its entirety, the electrodes and/or substrates of this invention have, preferably, a surface with polar reactive groups, such as a hydroxyl (—OH) group. Materials suitable for use with or as electrodes and/or substrates for anchoring the conductive layers and luminescent media of this invention should conform to the following requirements: any solid material exposing a high energy (polar) surface to which layer-forming molecules can bind. These may include: metals, metal oxides such as $SiO_2$, $TiO_2$, $MgO$, and $Al_2O_3$ (sapphire), semiconductors, glasses, silica, quartz, salts, organic and inorganic polymers, organic and inorganic crystals and the like.

Inorganic oxides (in the form of crystals or thin films) are especially preferred because oxides yield satisfactory hydrophilic metal hydroxyl groups on the surface upon proper treatment. These hydroxyl groups react readily with a variety of silyl coupling reagents to introduce desired coupling functionalities that can in turn facilitate the introduction of other organic components.

The physical and chemical nature of the anode materials dictates specific cleaning procedures to improve the utility of this invention. Alkaline processes (NaOH aq.) are generally used. This process will generate a fresh hydroxylated surface layer on the substrates while the metal oxide bond on the surface is cleaved to form vicinal hydroxyl groups. High surface hydroxyl densities on the anode surface can be obtained by sonicating the substrates in an aqueous base bath. The hydroxyl groups on the surface will anchor and orient any of the molecular components/agents described herein. As described more fully below, molecules such as organosilanes with hydrophilic functional groups can orient to form the conductive layers.

Other considerations relating to the design, material choice and construction of electrodes and/or substrates useful with this invention are as provided in the above referenced and incorporated U.S. Pat. No. 5,409,783 and in particular cols. 21–23 thereof, such considerations as would be modified by those skilled in the art in accordance with the molecular conductive layers, and assembly methods and objects of the present invention.

The conductive layers and/or organic luminescent medium of the devices/articles of this invention preferably contain at least two separate layers, at least one layer for transporting electrons injected from the cathode and at least one layer for transporting holes injected from the anode. As is more specifically taught in U.S. Pat. No. 4,720,432, incorporated herein by reference in its entirety, the latter is in turn preferably at least two layers, one in contact with the anode, providing a hole injecting zone and a layer between the hole injecting zone and the electron transport layer, providing a hole transporting zone. While several preferred embodiments of this invention are described as employing at least three separate organic layers, it will be appreciated that either the layer forming the hole injecting zone or the layer forming the hole transporting zone can be omitted and the remaining layer will perform both functions. However, enhanced initial and sustained performance levels of the articles or devices of this invention can be realized when separate hole injecting and hole transporting layers are used in combination.

Porphyrinic and phthalocyanic compounds of the type described in cols. 11–15 of the referenced/incorporated U.S. Pat. No. 5,409,783 can be used to form the hole injecting zone. In particular, the phthalocyanine structure shown in column 11 is representative, particularly where X can be, but is not limited to, an alkyltrichlorosilane, alkyltrialkoxysilane, dialkyldialkoxysilane, or dialkyldichlorosilane functionality and where the alkyl and alkoxy groups can contain 1–6 carbon atoms or is hydrogen. Preferred porphyrinic compounds are represented by the structure shown in col. 14 and where R, $T^1$ and $T^2$ can be but are not limited to an alkyltrichlorosilane, alkyltrialkoxysilane, dialkyldialkoxysilane, or dialkyldichlorosilane functionality and where the alkyl and alkoxy groups contain 1–6 carbon atoms or is hydrogen. (See, also, FIGS. 1A and 1B, herein.) Preferred phthalocyanine- and porphyrin-based hole injection agents include silicon phthalocyanine dichloride and 5,10,15,20-tetraphenyl-21H,23H- porphine silicon (IV) dichloride, respectively.

Figure 2A:
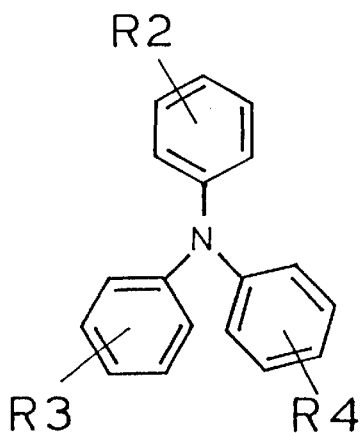
FIGS. 2A–2C show structural formulae for arylamine compounds which are illustrative examples of compounds of the type which can be used as hole transport compounds/agents in the preparation of the molecular conductive or hole transport layers and electroluminescent media of this invention.
Figure 2B:
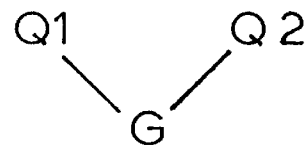
Figure 2C:
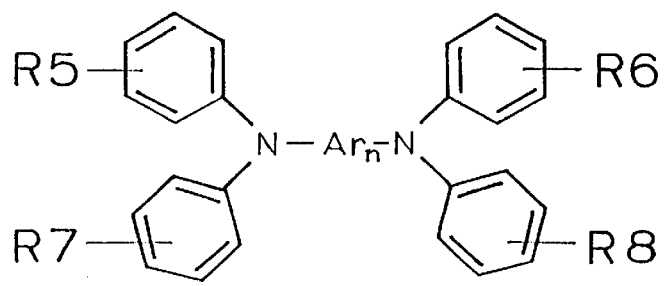

The hole transporting layer is preferably one which contains at least one tertiary aromatic amine, examples of which are as described in FIGS. 2A–2C and Examples 1 and 2. Other exemplary arylamine core structures are illustrated in U.S. Pat. No. 3,180,730, which is incorporated herein by reference in its entirety, where the core structures are modified as described herein. Other suitable triarylamines substituted with a vinyl or vinylene radical and/or containing at least one active hydrogen containing group are disclosed in U.S. Pat. Nos. 5,409,783, 3,567,450 and 3,658,520. These patents are incorporated herein by reference in their entirety and the core structures disclosed are modified as described herein. In particular, with respect to the arylamines represented by structural formulas XXI and XXIII in cols. 15–16 of U.S. Pat. No. 5,409,703, $R^24$, $R^{25}$, $R^{26}$, $R^{27}$, $R^{30}$, $R^{31}$ and $R^{32}$ can be an alkyltrichlorosilane, alkyltrialkoxysilane, dialkyldialkoxysilane, or dialkyldichlorosilane functionality where the alkyl and alkoxy groups can contain 1–6 carbon atoms or is hydrogen.

Figure 3A:
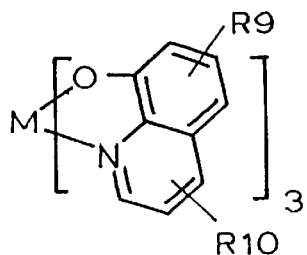
FIGS. 3A–3C show structural formulae for aryl compounds which are illustrative of examples of compounds of the type which can be used as emissive compounds/agents in the preparation of the molecular conductive layers and electroluminescent media of this invention.
Figure 3B:
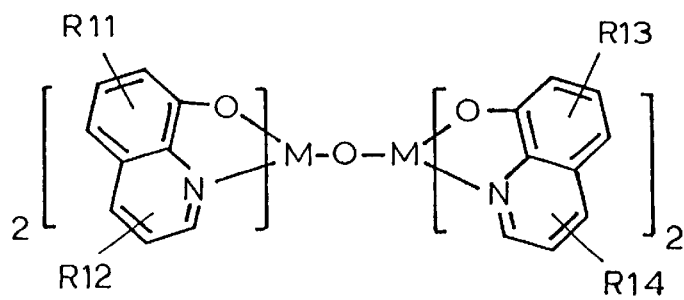
Figure 3C:
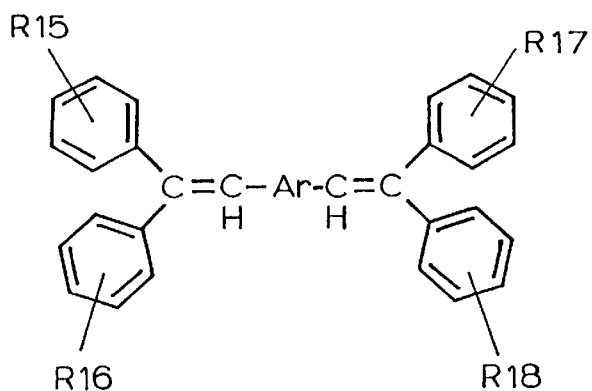

Molecular components of this invention comprising emissive agents and/or the emissive layer include those described herein in FIGS. 3A–3C and Example 5. Other such components/agents include various metal chelated oxinoid compounds, including chelates of oxide (also commonly referred to as 8-quinolinol or 8-hydroxyquinoline), such as those represented by structure III in col. 8 of the referenced and incorporated U.S. Pat. No. 5,409,783, and where $Z^2$ can be but is not limited to an alkyltrichlorosilane, alkyltrialkoxysilane, dialkyldialkoxysilane, or dialkyldichlorosilane functionality and where the alkyl and alkoxy groups can contain 1–6 carbon atoms or is hydrogen. Other such molecular components/emissive agents include the quinolinolato compounds represented in cols. 7–8 of U.S. Pat. No. 5,151,629, also incorporated herein by reference in its entirety, where a ring substituent can be but is not limited to an alkyltrichlorosilane, alkyltrialkoxysilane, dialkyldialkoxysilane, or dialkyldichlorosilane functionality and where the alkyl and alkoxy groups can contain 1–6 carbon atoms or is hydrogen. In a similar fashion, the dimethylidene compounds of U.S. Pat. No. 5,130,603, also incorporated herein by reference in its entirety, can be used, as modified in accordance with this invention such that the aryl substituents can include an alkyltrichlorosilane, alkyltrialkoxysilane, dialkyldialkoxysilane, or dialkyldichlorosilane functionality and where the alkyl and alkoxy groups can contain 1–6 carbon atoms or is hydrogen.

Other components which can be used as emissive agents include without limitation anthracene, naphthalene, phenanthrene, pyrene, chiysene, perylene and other fused ring compounds, or as provided in col. 17 of the previously referenced and incorporated U.S. Pat. No. 5,409,783, such compounds as modified in accordance with this invention and as more fully described above. Modifiable components also include those described in U.S. Pat. Nos. 3,172,862, 3,173,050 and 3,710,167—all of which are incorporated herein by reference in their entirety.

Figure 4A:
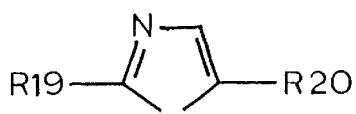
FIGS. 4A–4C show structural formulae for heterocyclic compounds which are illustrative examples of compounds of the type which can be used as electron transport components/agents in the preparation of the molecular conductive or electron transport layers and in electroluminescent media of this invention.
Figure 4B:
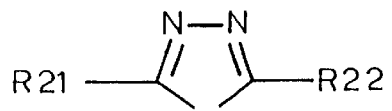
Figure 4C:
Figure 5A:
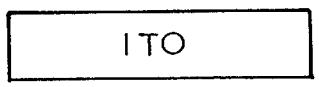
FIGS. 5A and 5B (ITO is indium-tin-oxide; HTL is hole transport layer and ETL is electron transport layer) show, schematically and in a step-wise manner by way of illustrating the present invention, use of the components/agents of Examples 1–5 and FIGS. 1–4 in the self-assembly and preparation of an organic light-emitting diode device. In particular, the molecular representation
Figure 5A:
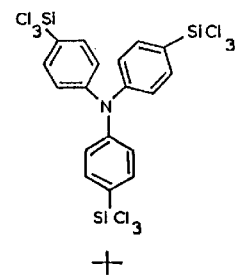
Figure 5A:
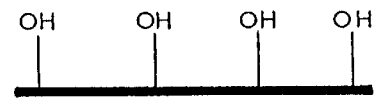
Figure 5A:
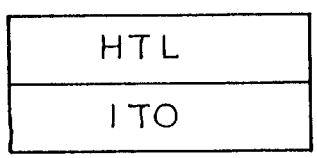
Figure 5A:
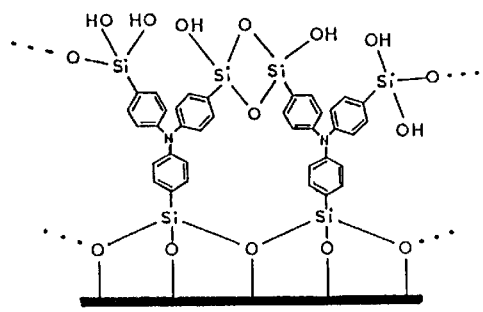
Figure 5A:
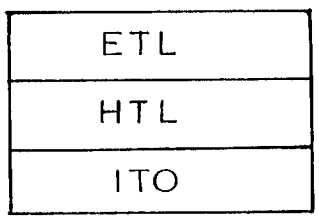
Figure 5A:
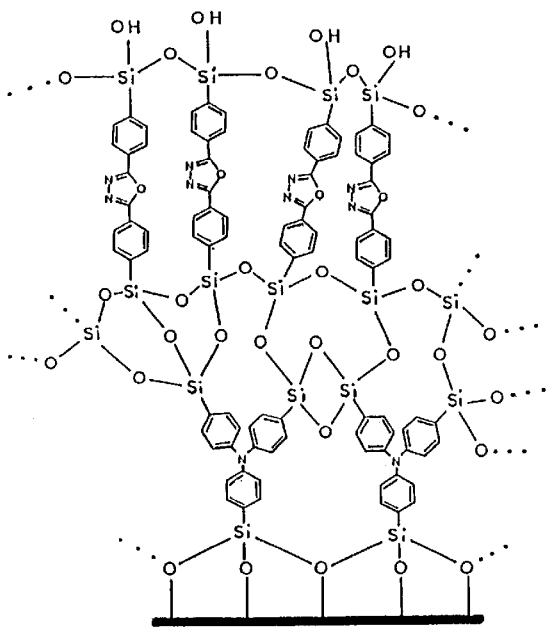
Figure 5B:
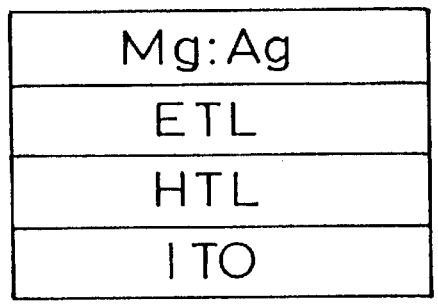
Figure 5B:
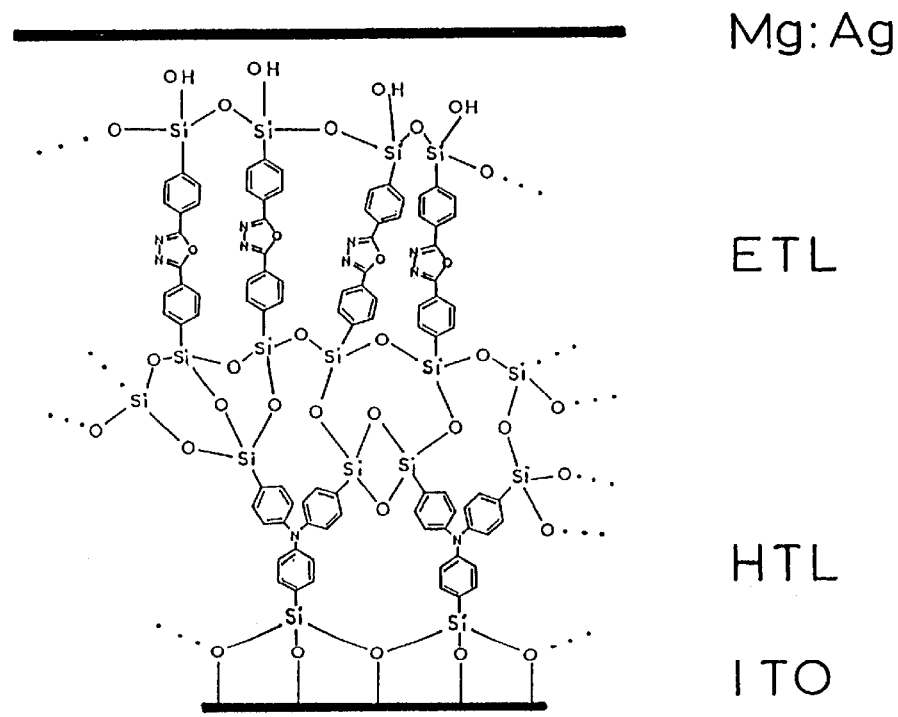

Molecular components which can be utilized as electron injecting or electron transport agents and/or in conjunction with an electron injection or electron transport layer are as described in FIGS. 4A–4C and Examples 3(a)–(d) and 4. Other such components include oxadiazole compounds such as those shown in cols. 12–13 of U.S. Pat. No. 5,276,381, also incorporated herein by reference in its entirety, as such compounds would be modified in accordance with this invention such that the phenyl substituents thereof each include an alkyltrichlorosilane, alkyltrialkoxysilane, dialkyldialkoxysilane, or dialkyldichlorosilane functionality and where the alkyl and alkoxy groups can contain 1–6 carbon atoms or is hydrogen. Likewise, such components can be derived from the thiadiazole compounds described in U.S. Pat. No. 5,336,546 which is incorporated herein by reference in its entirety.

As described above, inorganic silicon moieties can be used in conjunction with the various molecular components, agents, conductive layers and/or capping layers. In particular, silane moieties can be used with good effect to impart mechanical, thermal, chemical and/or photochemical stability to the luminescent medium and/or device. Such moieties are especially useful in conjunction with the methodology described herein. Degradation is minimized until farther synthetic modification is desired. Hydrolysis of an unreacted silicon/silane moiety provides an Si—OH functionality reactive with a silicon/silane moiety of another component, agent and/or conductive layer. Hydrolysis proceeds quickly in quantitative yield, as does a subsequent condensation reaction with an unreacted silicon/silane moiety of another component to provide a siloxane bond sequence between components, agents and/or conductive layers.

In general, the molecular agents/components in FIGS. 1–4 can be prepared with a lithium or Grignard reagent using synthetic techniques known to one skilled in the art and subsequent reaction with halosilane or alkoxysilane reagents. Alternatively, unsaturated olefinic or acetylenic groups can be appended from the core structures using known synthetic techniques. Subsequently, halosilane or alkoxysilane functional groups can be introduced using hydrosilation techniques, also known to one skilled in the art. Purification is carried out using procedures appropriate for the specific target molecule.

It has been observed previously that the performance characteristics of electroluminescent articles of the type described herein can be enhanced by the incorporation of a layer having a dielectric function between the anode and, for instance, a hole transport layer. Previous studies show that the vapor deposition of thin layers of LiF onto an anode before deposition of the other layer(s) improves performance in the areas of luminescence and quantum efficiency. However, this technique is limited in that the deposited LiF films are rough, degrade in air and do not form comformal, pinhole-free coatings.

The present invention is also directed to the application of self-assembly techniques to form layers which cap an electrode, provide dielectric and other functions and/or enhance performance relative to the prior art. Such capping layers are self-assembled films which are conformal in their coverage, can have dimensions less than one nanometer and can be deposited with a great deal of control over the total layer thickness. Accordingly, the present invention also includes an electroluminescent article or device which includes (1) an anode, (2) at least one molecular capping layer coupled to the anode with silicon-oxygen bonds, with each capping layer coupled one to another with silicon-oxygen bonds, (3) a plurality of molecular conductive layers, with one of the layers coupled to the capping layer with silicon-oxygen bonds and each conductive layer coupled one to another with silicon-oxygen bonds, and (4) a cathode in electric contact with a conductive layer. Likewise, and in accordance with this invention, the capping layer can be deposited on a conductive layer and/or otherwise introduced so as to be adjacent to a cathode, to enhance overall performance.

More generally and within the scope of this invention, the anode is separated from the cathode by an organic luminescent medium. The anode and cathode are connected to an external power source by conductors. The power source can be a continuous direct, alternating or intermittent current voltage source. A convenient conventional power source, including any desired switching circuitry, which is capable of positively biasing the anode with respect to the cathode, can be employed. Either the anode or cathode can be at ground potential.

In preferred embodiments, each conductive and/or capping layer has molecular components, and each molecular component has at least two silicon moieties. In highly preferred embodiments, each such conductive and/or capping component is a halogenated or alkoxylated silane, and silicon-oxygen bonds are obtainable from the condensation of the silane moieties with hydroxy functionalities. Without limitation, a preferred capping material is octachlorotrisiloxane. The anode and cathode can be chosen and/or constructed as otherwise described herein.

In part, the present invention is a method of using molecular dimension to control the forward light output of an electroluminescent device. The inventive method includes (1) providing an electrode and a molecular layer thereon, the layer coupled to the electrode with first molecular components having at least two silicon moieties reactive to a hydroxy functionality; and (2) modifying the thickness of the layer by reacting the molecular components with second components to form a siloxane bond sequence between the first and second molecular components, the second molecular components having at least two silicon moieties also reactive to a hydroxy functionality.

In preferred embodiments of this inventive method, at least one silicon moiety is unreacted after reaction with a hydroxy functionality. In highly preferred embodiments, the modification further includes hydrolyzing an unreacted silicon moiety of one of the molecular components to form a hydroxysilyl functionality and condensing the hydroxysilyl functionality with a silicon moiety of a third molecular component to form a siloxane bond sequence between the second and third molecular components. In highly preferred embodiments, the silicon moieties are halogenated or alkoxylated silane moieties.

In part, the present invention also includes any electroluminescent article for generating light upon application of an electrical potential across two electrodes. Such an article includes an electrode having a surface portion and a molecular layer coupled and/or capped thereon. The layer includes molecular components, and each component has at least two silicon moieties. The layer is coupled to the electrode with silicon-oxygen bonds. In preferred embodiments, each silicon moiety is a halogenated silane, and silicon-oxygen bonds are obtained from a condensation reaction. Likewise, and without limitation, the electrode has a substrate with a hydroxylated surface portion transparent to near-IR and visible wavelengths of light. Such a layer can be utilized to cap the electrode and/or enhance performance as otherwise described herein. More generally, in such an article or any other described herein, the luminescent medium can be constructed using either the self-assembly techniques described herein or the materials and techniques of the prior art.

EXAMPLES OF THE INVENTION

The following non-limiting examples and data illustrate various aspects and features relating to the articles/devices and/or methods of the present invention, including the assembly of a luminescent medium having various molecular components/agents and/or conductive layers, as are available through the synthetic methodology described herein. In comparison with the prior art, the present methods and articles/devices provide results and data which are surprising, unexpected and contrary to the prior art. While the utility of this invention is illustrated through the use of several articles/devices and molecular components/agents/layers which can be used therewith, it will be understood by those skilled in the art that comparable results are obtainable with various other articles/devices and components/agents/layers, as are commensurate with the scope of this invention.

Example 1

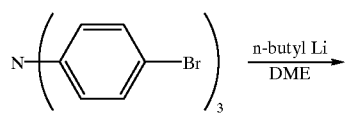

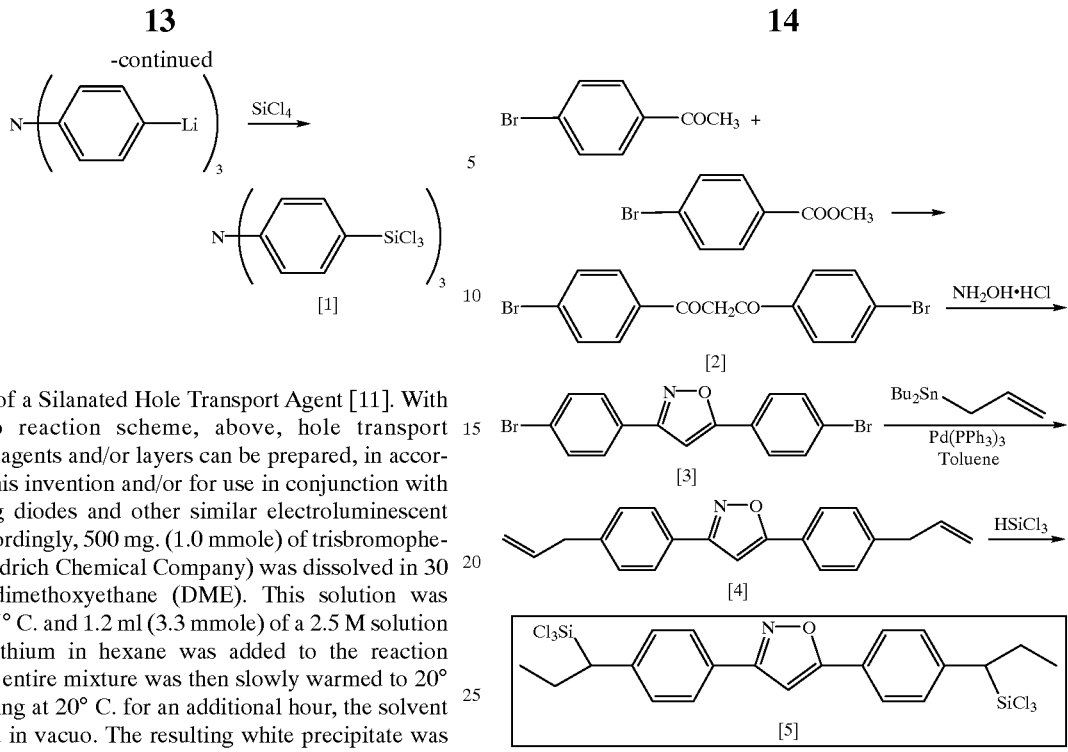

Synthesis of a Silanated Hole Transport Agent [11]. With reference to reaction scheme, above, hole transport components, agents and/or layers can be prepared, in accordance with this invention and/or for use in conjunction with light-emitting diodes and other similar electroluminescent devices. Accordingly, 500 mg. (1.0 mmole) of trisbromophenylamine (Aldrich Chemical Company) was dissolved in 30 ml of dry dimethoxyethane (DME). This solution was cooled to −45° C. and 1.2 ml (3.3 mmole) of a 2.5 M solution of n-butyl lithium in hexane was added to the reaction mixture. The entire mixture was then slowly warmed to 20° C. After stirring at 20° C. for an additional hour, the solvent was removed in vacuo. The resulting white precipitate was washed (3×20 ml) with dry pentane and redissolved in 30 ml dry DME. This solution was subsequently poured into 10 ml (87 mmole) of silicon tetrachloride at a rate of 1 ml/min. The entire reaction mixture was then refluxed for two hours. The resulting supernatent was separated from the precipitate, and the solvent again removed in vacuo yielding a green-brown residue. A white solid was obtained from this residue upon sublimation at $10^6$ torr. Characterization: $^1$H NMR (600 MHz, $C_6D_6$, 20° C.): δ 7.07 (d, 6H, Ar-H); δ 7.05 (d, 6H, Ar-H); EI-MS (m/z): 645 (M+).

Example 2

With reference to FIGS. 2A–2C and the representative arylamines provided therein, other hole transport agents and/or layers of this invention can be obtained by straight-forward application of the silanation procedure described above in Example 1, with routine synthetic modification(s) and optimization of reaction conditions as would be well-known to those skilled in the art and as required by the particular arylamine. Likewise, preliminary halogenation/bromination can be effected using known synthetic procedures. Alternatively, the arylamines of FIGS. 2A–2C and other suitable substrates can be prepared using other available synthetic procedures to provide multiple silane reaction centers for use with the self-assembly methods and light-emitting diodes of this invention. Core molecular substrates of the type from which the arylamines of FIGS. 2A–2C can be prepared are described by Stukelji et al. in *Science*, 267, 1969 (1995), which is incorporated herein by reference in its entirety.

Example 3

Synthesis of a Silanated Electron Transport Agent. With reference to Examples 3(a)–(d) and corresponding reaction schemes, below, electron transport agents and/or layers can be prepared, in accordance with this invention and/or for use in conjunction with light-emitting diodes and other similar electroluminescent devices.

Example 3a

Synthesis of 4'-Bromo-2-(4-bromobenzoyl)acetophenone [2]. In a 1-liter three neck round bottom flask, 43 g (0.2 mol) methyl 4-bromobenzoic acid and 17.6 g (0.4 mol) sodium hydride were dissolved in 200 ml dried benzene and heated to 60° C. Next, 39.8 g (0.2 mol) 4-bromoacetophenone in 100 ml dry benzene was slowly added through a dropping funnel, and 1 ml methanol was added to the flask to initiate the reaction. After the mixture was refluxed overnight, the reaction was quenched by adding methanol and pouring it into ice water. The pH of the mixture was brought down to 7.0 using 5 N sulfuric acid. A solid was collected, washed with water, and recrystallized from benzene to give a light yellow product. Characterization. Yield: 30.3 g (40%). $^1$H NMR (300 MHz, $CDCl_3$, 20° C., δ): 7.84 (d, 4H, ArH); 7.62 (d, 4H, ArH); 6.77 (s, 2H, $CH_2$). EI-MS 382 (M+), 301, 225, 183, 157.

Example 3b

Synthesis of 3,5-Bis(4-bromophenyl)isoxazole 131. In a 250 ml round bottom flask, 4 g (10.4 mmol) of [2] was dissolved in 100 ml dry dioxane and heated to reflux, then 3.0 g (43.2 mmol) hydroxylamine hydrogen chloride in 10 ml water and 5 ml (25 mmol) 5 N NaOH was then dropped into the refluxing mixture. After 12 hours, the reaction mixture was cooled down to room temperature, and the solvent was removed in vacuo. The product was recrystallized from ethanol. Characterization. Yield: 3.41 g (85%). M.P. 218.5–219.5° C. 1H NMR (300 MHz, $CDCl_3$, 20° C., δ): 7.78 (d, 2H, ArH), 7.74 (d 2H, Ar'H), 7.66 (d, 2H, ArH), 7.62 (d, 2H, Ar'H), 6.82 (s, 1H, isoxazole proton). EI-MS: 379 (M+), 224, 183, 155.

Example 3c

Synthesis of 3,5-Bis(4-allylphenyl)isoxazole [4]). In a 250 ml three-neck round bottom flask, 3.77 g (10 mmol) of [3], 460 mg. (0.4 mmol) tetrakis-(triphenylphosphine)

palladium, and 7.28 g (22 mmol) tributylallyltin were dissolved in 100 ml. dried toluene and degassed with nitrogen for 30 min. The mixture was heated to 100° C. for 10 h, then cooled down to room temperature. Next, 50 ml. of a saturated aqueous ammonium fluoride solution was subsequently added to the mixture. The mixture was extracted with ether, and the combined organic layer was washed by water, then brine, and finally dried over sodium sulfate. The solvent was removed in vacuo. The residue was purified by column chromatography. (first, 100% hexanes, then chloroform:hexanes [80:20]). Characterization. Yield: 1.55 g (57%). [1] H NMR (300 MHz, CDCl$_3$, 20° C., δ): 7.78 (d, 2H, ArH), 7.74 (d, 2H, Ar'H), 7.34 (d, 2H, ArH), 7.30 (d, 2H, Ar'H), 6.78 (s, 1H, isoxazole proton), 5.96 (m, 2H, alkene H), 5.14 (d, 4H, terminal alkene H), 3.44 (d, 4H, methylene group). EI-MS: 299 (M+), 258, 217.

Example 3d

Synthesis of 3,5-Bis(4-(N-trichlorosilyl)propylphenyl) isoxazole [5]. To 2 ml of THF was added 5 mg of [4], 3.4 μl of HSiC$_3$ and 0.8 mg. of H$_2$PtCl$_6$ were added to 2 ml of THF. The reaction was heated at 50° C. for 14h. The solvent was then removed in vacuo. A white solid was obtained from this residue upon sublimation at $10^6$ torr. Characterization. $^1$H NMR (300 MHz, d$^8$–THF, 20° C., δ): 7.72 (d, 2H, ArH), 7.68 (d, 2H, Ar'H), 7.36 (d, 2H, ArH), 7.32 (d, 2H, Ar'H), 6.30(s, 1H, isoxazole); 2.52 (t, 2H, CH); 1.55 (m, 4H, CH$_2$); 0.85 (t, 6H, CH$_3$).

Example 4

With reference to FIGS. 4A–4C and the representative heterocycles provided therein, other electron transport agents and/or layers of this invention can be obtained by straight-forward application of the silanation procedure described above in Example 3, with routine synthetic modification(s) and optimization of reaction conditions as would be well-known to those skilled in the art and as required by the particular heterocyclic substrate. Preliminary halogenation/bromination can be effected using known synthetic procedures or through choice of starting materials enroute to a given heterocycle. Alternatively, the heterocycles of FIGS. 4A–4C and other suitable substrates can be prepared using other available synthetic procedures to provide multiple silane reaction centers for use with the self-assembly methods and light-emitting diodes of this invention. Core molecular substrates of the type from which the heterocycles of FIGS. 4A–4C can be prepared are also described by Strukelji et al. in *Science*, 267, 1969 (1995).

Example 5

With reference to FIGS. 3A–3C and the representative chromophores provided therein, emissive agents and/or layers, in accordance with this invention, can be obtained by appropriate choice of starting materials and using halogenation and silanation procedures of the type described in Examples 1–4, above. Alternatively, other chromophores can be silanated using other available synthetic procedures to provide multiple silane reaction centers for use with the self-assembly methods and light-emitting diodes of this invention. Regardless, in accordance with this invention, such emissive agents or chromophores can be used for emission of light at wavelengths heretofore unpractical or unavailable. Likewise, the present invention allows for the use of multiple agents or chromophores and construction of an emissive layer or layers such that a combination of wavelengths and/or white light can be emitted.

Example 6

Figure 6:
FIG. 6 shows an alternative synthetic sequence enroute to several rag arylamine components/agents, also in accordance with the present invention.
Figure 6:
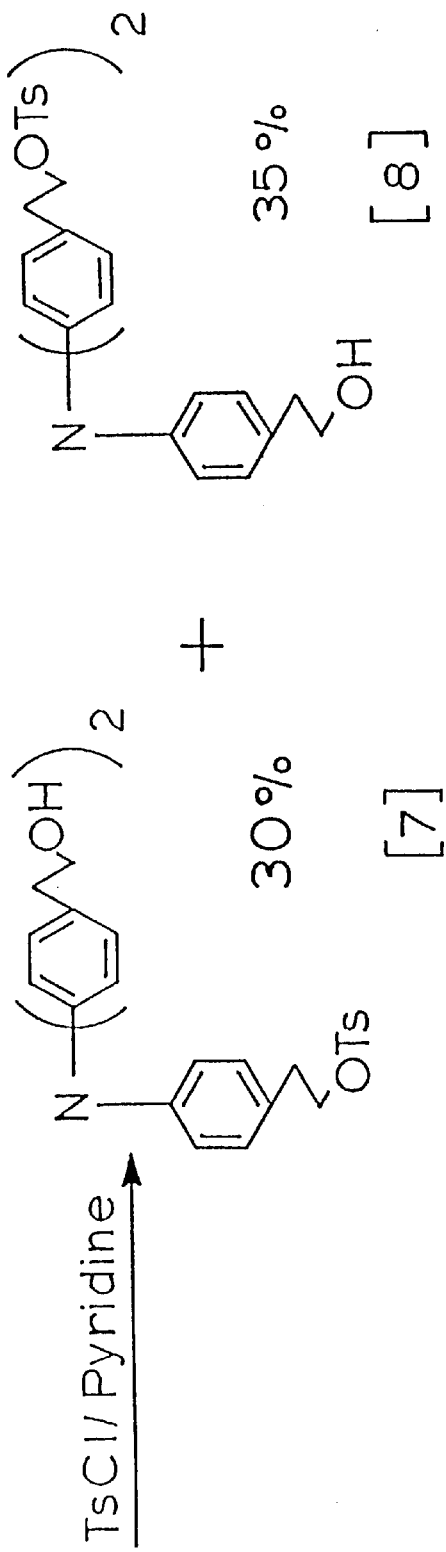

Examples 6(a)–6(c) together with FIG. 6 illustrate the preparation of other molecular components which can be used in accordance with this invention.

Example 6a

Synthesis of Tertiary Arylamine [6]. Together, 14.46 g (20 mmole) of tris(4-bromophenyl)amine and 500 ml of dry diethyl ether were stirred at −78° C. under a nitrogen atmosphere. Next 112.5 ml of a 1.6 M n-butyllithium solution in hexanes was slowly added to the reaction mixture over 1.5 hours. The reaction was then warmed to −10° C. and stirred for an additional 30 minutes. The reaction was then cooled down again to −78° C. before the addition of 22 g (0.5 mole) of ethylene oxide. The mixture was stirred and slowly warmed to room temperature over 12 hours. Next, 2 ml of a dilute NH$_4$Cl solution was then added to the reaction mixture. The solvent was evaporated under vacuum yielding a light green solid. The product was purified using column chromatography. The column was first eluted with chloroform and then with MeOH:CH$_2$Cl$_2$ (5:95 v/v). The resulting light gray solid was recrystallized using chloroform to give 1.89 g. Yield: 25%. $^1$H NMR (δ, 20° C., DMSO): 2.65 (t,6H), 3.57 (q,6H), 4.64 (t,3H), 6.45 (d,6H), 7.09 (d,6H). EI-MS: 377 (M+), 346 (M+−31), 315 (M+−62). HRMS: 377.2002. calcd; 377.1991. Anal. Calculated for C$_{24}$H$_{27}$NO$_3$; C, 76.36; H, 7.21; N, 3.71. Found: C, 76.55; H, 7.01; N, 3.52.

Example 6b

Synthesis of Tosylated Arylamine 171. A pyridine solution of tosyl chloride (380 mg in 5 ml) was added over 5 minutes to a pyridine solution of [6] (500 mg in 10 ml, from Example 6a) cooled to 0° C. The mixture was stirred for 12 hours, then quenched with water and extracted with chloroform. The organic extract was washed with water, 5% sodium bicarbonate, and dried with magnesium sulfate. After filtration, the chloroform solution was then evaporated to dryness under vacuum and purified using column chromatography. The column was first eluted with hexane:CHCl$_3$ (1:2 v/v) yielding [7]. $^1$H NMR (300 MHz, δ, 20° C., CDCl$_3$): 2.45 (s,3H), 2.90 (t,6H), 3.02 (t,3H), 3.70 (t,3H), 4.19 (t,6H), 6.92 (d,2H), 6.98 (d,4H), 7.00 (d,4H), 711 (d,2H), 7.32 (d,2H), 7.77 (d,2H).

Example 6c

Synthesis of Tosylated Arylamine [8]. Continuing the chromatographic procedure similar for 2 (from Example 6b)but changing the eluting solvent to 100% CHCl$_3$ yielded [8]. $^1$H NMR (300 MHz, δ, 20° C., CDCl$_3$): 2.44 (s,6H), 2.91 (t,3H), 3.02 (t,6H), 3.70 (t,6H), 4.19 (t,3H), 6.92 (d,4H), 6.98 (d,2H), 7.00 (d,2H), 7.11 (d,4H), 7.32 (d,4H), 7.77 (d,4H).

Example 7

Figure 7:
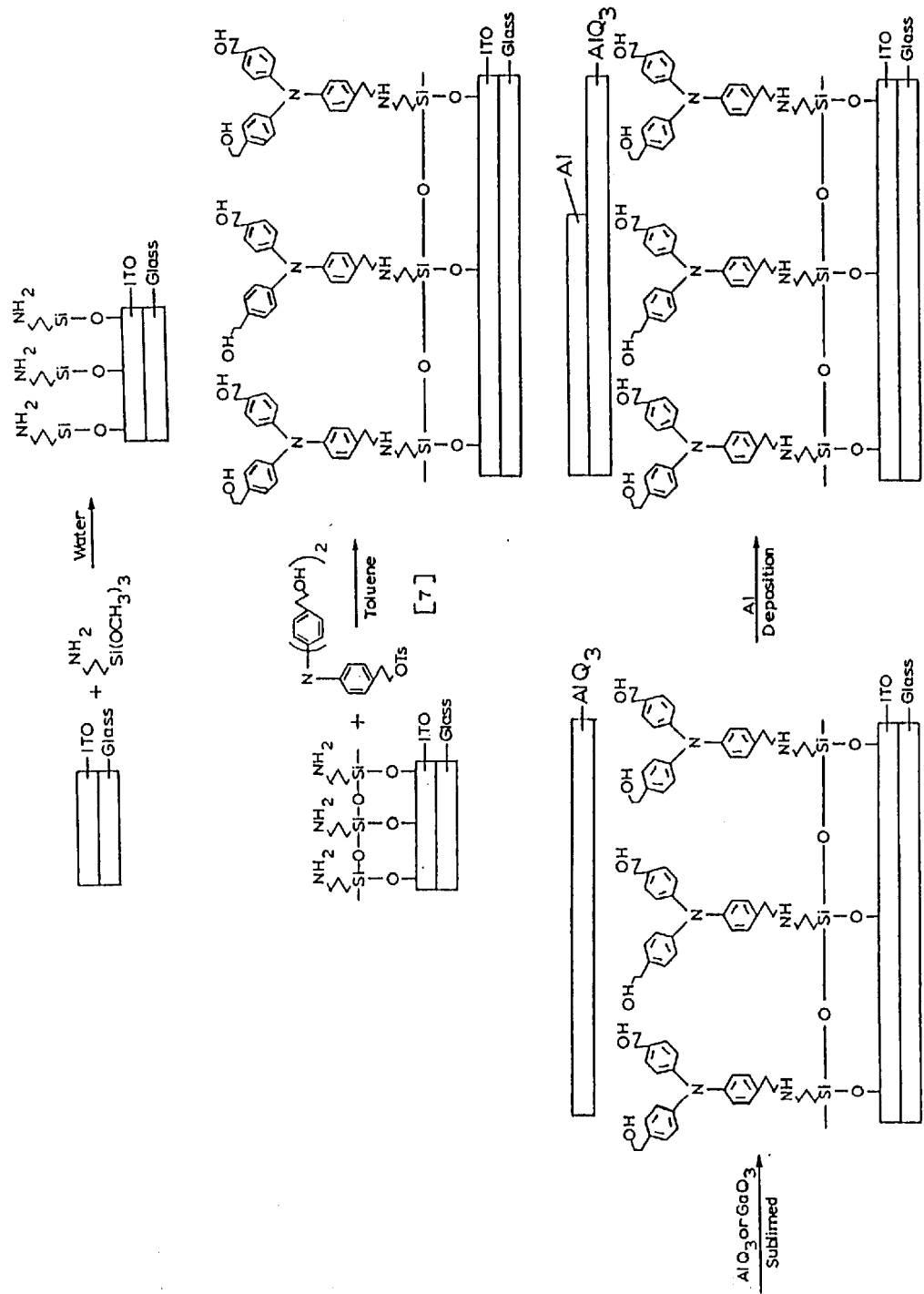
FIG. 7 shows, schematically and by way of illustrating an alternative embodiment of the present invention, use of the components/agents of FIG. 6 in the preparation of another representative electroluminescent device.

Using the arylamines of Examples 6 and with reference to FIG. 7, an electroluminescent article/device also in accordance with this invention is prepared as described, below. It is understood that the arylamine component can undergo another or a series of reactions with a silicon/silane moiety of another molecular component/agent to provide a siloxane bond sequence between components, agents and/or conductive layers. Similar electroluminescent articles/devices and conductive layers/media can be prepared utilizing the various other molecular components/agents and/or layers described above, such as in Examples 1–5 and FIGS. 1–4, in conjunction with the synthetic modifications of this invention and as required to provide the components with the appropriate reactivity and functionality necessary for the assembly method(s) described herein.

Example 7a

This example of the invention shows how slides can be prepared/cleaned prior to use as or with electrode materials. An indium-tin-oxide (ITO)-coated soda lime glass (Delta Technologies) was boiled in a 20% aqueous solution of ethanolamine for 5 minutes, rinsed with copious amounts of distilled water and dried for 1 hour at 120° C.; alternatively and with equal effect, an ITO-coated soda lime glass (Delta Technologies) was sonicated in 0.5M KOH for 20 minutes, rinsed with copious amounts of distilled water and then ethanol, and dried for 1 hour at 120° C.

Example 7b

Electroluminescent Article Fabrication and Use. The freshly cleaned ITO-coated slides were placed in a 1% aqueous solution of 3-aminopropyltrimethoxysilane and then agitated for 5 minutes. These coated slides were then rinsed with distilled water and cured for 1 hour at 120° C. The slides were subsequently placed in a 1% toluene solution of [7] (or [8] from Example 6) and stirred for 18 hours under ambient conditions. Afterwards, the slides were washed with toluene and cured for 15 minutes at 120° C. AlQ$_3$ (or GaQ$_3$; Q=quinoxalate) was vapor deposited on top of the amine-coated slides. Finally, 750–1000 Å of aluminum was vapor deposited over the metal quinolate layer. Wires were attached to the Al and ITO layers using silver conducting epoxy (CircuitWorks™), and when a potential (<7V) was applied, red, orange, and/or green light was emitted from the device.

Example 8

One or more capping layers comprising Cl$_3$SiOSiCl$_2$OSiCl$_3$ are successively deposited onto clean ITO-coated glass where hydrolysis of the deposited material followed by thermal curing/crosslinking in air at 125° C. yields a thin (~7.8Å) layer of material on the ITO surface. X-ray reflectivity measurements indicate that the total film thickness increases linearly with repeated layer deposition, as seen in FIG. 8. Other molecular components can be used with similar effect. Such components include, without limitation, the bifunctional silicon compounds described in U.S. Pat. No. 5,156,918, at column 7 and elsewhere therein, incorporated by reference herein in its entirety. Other useful components, in accordance with this invention include those trifunctional compounds which cross-link upon curing. As would be well known to those skilled in the art and made aware of this invention, such components include those compounds chemically reactive with both the electrode capped and an adjacent conductive layer.

Example 9

Figure 9:
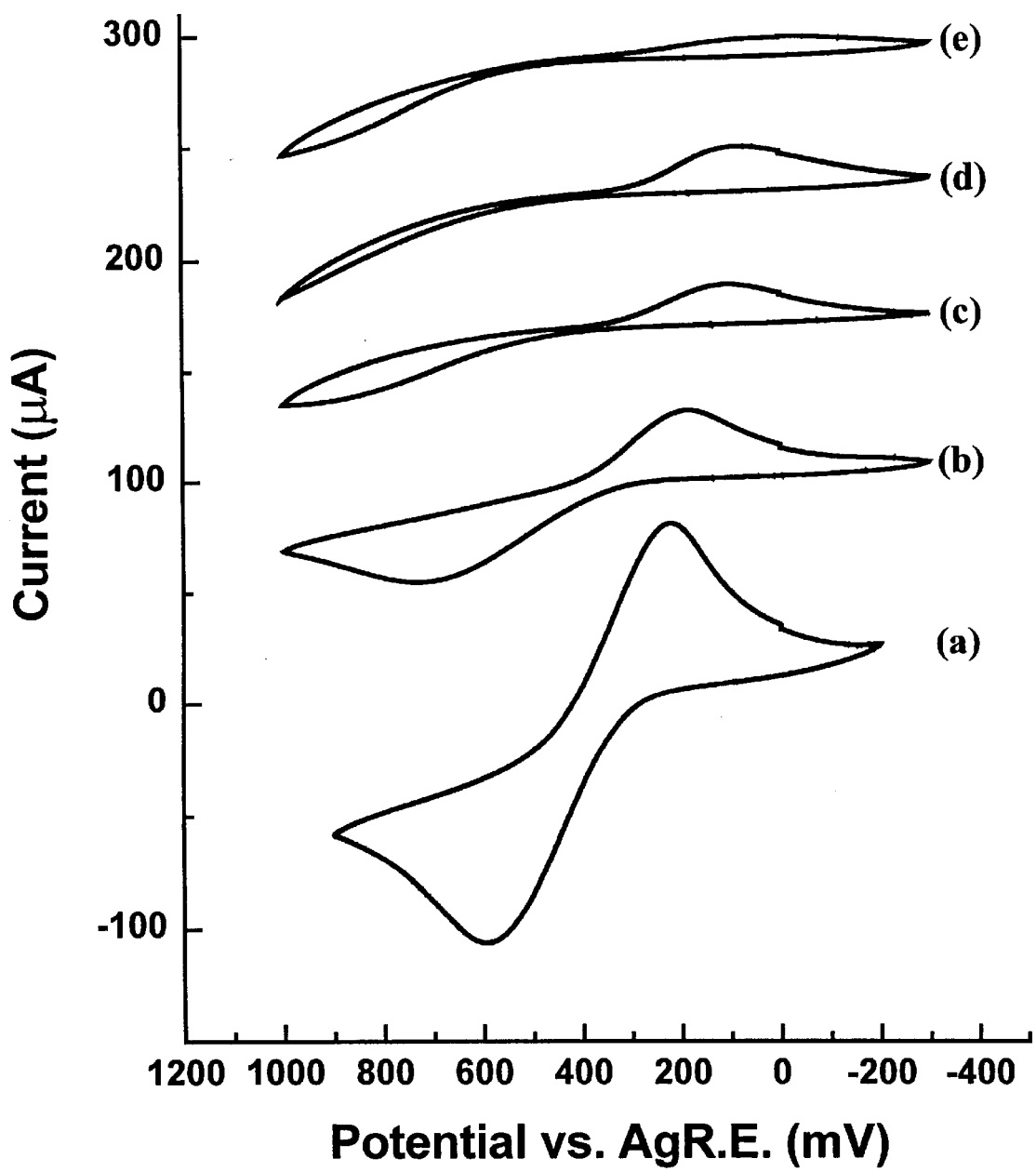
FIG. 9 graphically shows cyclic voltametry measurements, using $10^{-3}$M ferrocene in acetonitrile, taken after successive layer (c-e) deposition and as compared to a bare ITO electrode (a). Even one capping layer (b), in accordance with this invention, effectively blocks the electrode surface. Complete blocking is observed after deposition of three or four layers. The sweep rate was 100 V/sec, and the electrode area was about 0.7 $cm^2$.

Cyclic voltametry measurements shown in FIG. 9 using aqueous ferri/ferrocyanide show that there is considerable blocking of the electrode after the deposition of just one layer of the self-assembled capping material specified in Example 8. Other molecular components described, above, show similar utility. Almost complete blocking, as manifested by the absence of pinholes, is observed after application of three layers of capping material.

Example 10

Conventional organic electroluminescent devices consisting of TPD (600 Å)/ Alq (600 Å)/ Mg (2000 Å) were vapor-deposited on ITO substrates modified with the capping material specified in Example 8. FIGS. 10A–C show the behavior of these devices with varying thickness of the self-assembled capping material. These results show that such a material can be used to modify forward light output and device quantum efficiency. For a device with two capping layers, higher current densities and increased forward light output are achieved at lower voltages, suggesting an optimum thickness of capping material can be used to maximize performance of an electroluminescent article.

Example 11

This example illustrates how a capping material can be introduced to and/or used in the construction of an electroluminescent article. ITO-coated glass substrates were cleaned by sonication in acetone for 1 hour followed by sonication in methanol for 1 hour. The dried substrates were then reactively ion etched in an oxygen plasma for 30 seconds. Cleaned substrates were placed in a reaction vessel and purged with nitrogen. A suitable silane, for instance a 24 mM solution of octachlorotrisiloxane in heptane, was added to the reaction vessel in a quantity sufficient to totally immerse the substrates. (Other such compounds include those described in Example 8). Substrates were allowed to soak in the solution under nitrogen for 30 minutes. Following removal of the siloxane solution the substrates were washed and sonicated in freshly distilled pentane followed by a second pentane wash under nitrogen. Substrates were then removed from the reaction vessel washed and sonicated in acetone. Substrates were dried in air at 125° C. for 15 minutes. This process can be repeated to form a capping layer of precisely controlled thickness.

While the principles of this invention have been described in connection with specific embodiments, it should be understood clearly that these descriptions are added only by way of example and are not intended to limit, in any way, the scope of this invention. For instance, the present invention can be applied more specifically to the construction of second-order nonlinear optical materials as have been described in U.S. Pat. No. 5,156,918 which is incorporated herein by reference in its entirety. Likewise, the present invention can be used in conjunction with the preparation of optical waveguides of the type more specifically described and utilized in a co-pending application Ser. No. 08/355,639) entitled "Self-Assembled Superlattices and Waveguides Prepared for Use Therewith," filed on Dec. 14, 1994, abandoned in favor of 08/857,769, now U.S. Pat. No. 6,033,774 which is also incorporated herein by reference in its entirety. Another advantages and features will become apparent from the claims hereinafter, with the scope of the claims determined by the reasonable equivalents, as understood by those skilled in the art.

What is claimed is:

1. An electroluminescent article for generating light upon application of an electrical potential across two electrodes, said article comprising:
    an anode;
    at least one molecular dielectric capping layer coupled to said anode with silicon-oxygen bonds, and each said capping layer coupled one to another with silicon-oxygen bonds;
    a plurality of molecular conductive layers, one of said layers coupled to said capping layer with silicon-oxygen bonds and said conductive layers coupled one to another with silicon-oxygen bonds; and a cathode in electrical contact with said conductive layers.

2. The article of claim 1 wherein said conductive layers are selected from the group consisting of a hole injection layer, a hole transport layer, an electron transport layer and an emissive layer.

3. The article of claim 1 wherein each of said conductive layers comprises molecular components, each said molecular component having at least two silicon moieties.

4. The article of claim 3 wherein each said silicon moiety is a halogenated silane and said silicon-oxygen bonds are obtained from the condensation reaction of said silane moieties with hydroxy functionalities.

5. The article of claim 1 wherein said anode comprises a substrate having a hydroxylated surface portion, said surface portion transparent to near-IR and visible wavelengths of light.

6. The article of claim 5 wherein said hydroxylated surface portion includes $SiO_2$, $In_2O_3 \cdot xSnO_2$, Ge or Si.

7. The article of claim 6 wherein each said dielectric capping layer comprises molecular components, each said molecular component having at least two silicon moieties.

8. The article of claim 7 wherein each said silicon moiety is a halogenated silane and said silicon-oxygen bonds are obtained from the condensation reaction of said silane moieties with hydroxy functionalities.

9. An electroluminescent article for generating light upon application of an electrical potential across two electrodes, said article comprising two electrodes ad a molecular dielectric layer therebetween, said molecular dielectric layer coupled to at least one said electrode with silicon-oxygen bonds, said layer comprising molecular components and each said component having at least two silicon moieties.

10. The article of claim 9 wherein each silicon moiety is a halogenated silane and said silicon-oxygen bonds are condensation products.

11. The article of claim 9 wherein said electrode comprises a substrate having a hydroxylated surface portion, said surface portion transparent to near-IR and visible wavelengths of light.

12. The article of claim 11 wherein said hydroxylated surface portion includes $SiO_2$, $In_2O_3 \cdot xSnO_2$, Ge or Si.

13. The article of claim 9 wherein said molecular dielectric layer comprises a plurality of sublayers of molecular components, each said molecular component having at least two silicon moieties.

14. The article of claim 9 wherein each said silicon moiety is a halogenated silane and said silicon-oxygen bonds are condensation products.

15. A method of using molecular dimension to control forward light output of an electroluminescent device, said method comprising:

providing in sequence an electrode and a molecular dielectric layer thereon, said layer coupled to said electrode with first molecular components having at least two silicon moieties reactive to a hydroxy functionality; and modifying the thickness of said layer by reacting said first molecular components with second molecular components to form a siloxane bond sequence between said first and second molecular components, said second molecular components having at least two silicon moieties reactive to a hydroxy functionality.

16. The method of claim 15 where at least one silicon moiety of each of said second molecular components is unreacted after said reaction.

17. The method of Claim 16 wherein said modification includes hydrolyzing said unreacted silicon moieties to form hydroxysilyl functionalities, and condensing said hydroxysilyl functionalities with third molecular components having silicon moieties to form a siloxane bond sequence between said second and third molecular components.

18. The method of claim 15 wherein said silicon moieties are halogenated silane moieties.

19. The method of claim 18 wherein at least one silane moiety of each of said second molecular components is unreacted after said reaction.

20. The method of claim 19 wherein said modification includes hydrolyzing said unreacted silane moieties to form hydroxysilyl functionalities, and condensing said hydroxysilyl functionalities with third molecular components having silicon moieties to form a siloxane bond sequence between said second and third molecular components.

21. A method of using silicon molecular components of a luminescent medium to control charge migration and light emission within an electroluminescent device, said method comprising:

coupling an organic luminescent medium adjacent to an anode, said medium having molecular dielectric capping layers and molecular conductive layers with a plurality of silicon molecular components and a predetermined spatial distribution of said components therein, said medium coupled to said anode with silicon-oxygen bonds;

providing said medium adjacent said anode at least one of a hole injection zone or a hole transport zone; and migrating positive charge carriers through said medium for emissive interaction with negative charge carriers generated by said device.

22. The method of claim 21 wherein said hole transport zone includes a plurality of molecular components, each said component having at least two silicon moieties reactive with said anode to form silicon-oxygen bonds between said anode and said hole transport zone.

23. The method of claim 21 wherein an electron transport zone is coupled to said hole transport zone of said medium, said electron transport zone including a plurality of molecular components, each said component having at least two silicon moieties reactive with said hole transport zone to form silicon-oxygen bonds between said hole transport zone and said electron transport zone.

24. The method of claim 21 wherein said luminescent medium is modified by self-assembly of silane molecular components on said anode.

25. The method of claim 21 wherein said emitted light is released along an edge of said hole transport zone, through the anode, through the cathode, or through any combination thereof.

* * * * *

UNITED STATES PATENT AND TRADEMARK OFFICE
CERTIFICATE OF CORRECTION

PATENT NO. : 6,399,221 B1
DATED : June 4, 2002
INVENTOR(S) : Tobin J. Marks, Joshua E. Malinsky, Bernard Kippelen, Nasser Peyghambarian and Ghassan E. Jabbour It is certified that error appears in the above-identified patent and that said Letters Patent is hereby corrected as shown below:

Column 2,
Line 14, "filter" should be -- further --

Column 4,
Line 29, "tun-on" should be -- turn-on --

Column 13,
Line 35, "$10^6$" should be -- $10^{-6}$ --

Column 14,
Line 50, "131" should be -- [3] --

Signed and Sealed this

Seventeenth Day of December, 2002

JAMES E. ROGAN
*Director of the United States Patent and Trademark Office*

UNITED STATES PATENT AND TRADEMARK OFFICE
CERTIFICATE OF CORRECTION

PATENT NO. : 6,399,221 B1 Page 1 of 1
DATED : June 4, 2002
INVENTOR(S) : Tobin J. Marks et al.

It is certified that error appears in the above-identified patent and that said Letters Patent is hereby corrected as shown below:

<u>Title page,</u>
Item [73], Assignee, "Northwestern University, Evanston, IL (US)" should be
-- Northwestern University, Evanston, IL (US)
Arizona Board of Regents for the University of Arizona, Tucson, AZ (US) --

Signed and Sealed this

Fifteenth Day of June, 2004

JON W. DUDAS
*Acting Director of the United States Patent and Trademark Office*